(12) United States Patent
Khanuja

(10) Patent No.: US 7,035,129 B1
(45) Date of Patent: Apr. 25, 2006

(54) PARTITIONED SOURCE LINE ARCHITECTURE FOR ROM

(75) Inventor: Amit Khanuja, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 166 days.

(21) Appl. No.: 10/816,763

(22) Filed: Apr. 2, 2004

(51) Int. Cl.
  *G11C 5/06* (2006.01)

(52) U.S. Cl. .................. 365/63; 365/185.25; 365/203; 365/230.03

(58) Field of Classification Search .................. 365/63, 365/185.05, 185.25, 203, 230.03
  See application file for complete search history.

(56) References Cited

U.S. PATENT DOCUMENTS

| | | | | |
|---|---|---|---|---|
| 5,315,541 A | * | 5/1994 | Harari et al. | 365/185.13 |
| 5,526,307 A | * | 6/1996 | Yiu et al. | 365/185.01 |
| 5,600,586 A | * | 2/1997 | Lee | 365/104 |
| 6,438,064 B1 | * | 8/2002 | Ooishi | 365/230.03 |

* cited by examiner

*Primary Examiner*—Son T. Dinh
(74) *Attorney, Agent, or Firm*—Danamraj & Youst, P.C.

(57) ABSTRACT

A partitioned source line architecture for reducing leakage and power in a ROM. In one embodiment, a ROM includes of a plurality of storage cells organized as an array having M rows and N columns. Each column is associated with a precharged source line that is partitioned into a plurality of source line segments based on the number of row banks of the array. A plurality of local source line decoder circuits corresponding to the row banks are provided for decoding a selected source line segment based on the column address as well as a Bank Select signal generated from the row address of a particular cell. Local pull-down circuitry is provided with each bank for deactivating the selected source line segment upon commencing a memory access operation.

20 Claims, 5 Drawing Sheets

US 7,035,129 B1

PARTITIONED SOURCE LINE ARCHITECTURE FOR ROM

BACKGROUND OF THE INVENTION

1. Technical Field of the Invention

The present invention relates generally to semiconductor memories. More particularly, and not by way of any limitation, the present invention is directed to a partitioned source line architecture for read-only memory (ROM).

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that various types of circuitry such as analog blocks, non-volatile memory (e.g., read-only memory or ROM), random access memories (RAMs), and other "non-logic" cells are being required. The gap in available silicon capacity versus design productivity means that without some fundamental change in methodology, it will take several staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory, including ROM, is a key technology driver for SOC design. It is also well known that leakage and power consumption are two major factors in designing a high performance ROM core, especially where the device geometries continue to shrink. In typical ROM architectures, a transistor is placed at the intersection of every bitline (BL) and wordline (WL) with the transistor's gate being connected to the WL. Depending on the actual ROM code to be programmed, in one implementation, the transistor of the bit cell is either connected to the BL (for storing a binary 0) or left open (for storing a binary 1).

It should be appreciated that as the number of binary 0's on a BL increases, its capacitance also increases because of the parasitic diffusion capacitance of the transistor's drain connected thereto. It is possible that in some instances the ROM code to be programmed may have a large number of 0's on one or more BLs, resulting in degraded performance with respect to both leakage and power. Further, even where a virtual ground array is provided that utilizes precharged decoded source lines, only static leakage is effectively reduced. On the other hand, since each source line per I/O needs to make a full swing in a decoded source line architecture, the source lines can be a major power consuming component of the in a ROM with decoded source lines, especially where a large number of I/Os are provided. In a worst-case scenario, a source line may be associated with a column of storage cells having all zeros, thereby maximizing capacitance and power consumption. Thus, the issues of functional leakage (i.e., leakage during an access operation when a source line is driven low) and power consumption continue to remain unaddressed.

SUMMARY OF THE INVENTION

The present invention provides a partitioned source line architecture for reducing leakage and power in a ROM. In one embodiment, a ROM instance is comprised of a plurality of storage cells organized as an array having M rows and N columns. Each column is associated with a precharged source line that is partitioned into a plurality of source line segments based on the number of row banks of the array. A plurality of local source line decoder circuits corresponding to the row banks are provided for decoding a selected source line segment based on the column address as well as a Bank Select (BS) signal generated from the row address of a particular cell. Local pull-down circuitry is provided with each bank for deactivating the selected source line segment upon commencing a memory access operation.

In one aspect, the present invention is directed to a ROM instance that comprises a plurality of ROM cells organized as an array having M rows and N columns. A partitioned source line is associated with each of the N columns, wherein the partitioned source line includes a plurality of source line segments, each segment being decodable based on a BS signal that is operable to select a particular grouping (i.e., a bank) from the M rows and on a column address for selecting a particular column of the N columns.

In another aspect, the present invention is directed to a memory compiler for compiling at least one ROM instance having a partitioned source line architecture. The memory compiler includes a code portion for generating a plurality of ROM cells organized as an array having M rows and N columns, wherein each of the N columns is associated with a partitioned source line that comprises a plurality of source line segments based on a number of row banks of the array. Another a code portion is provided for generating a local control circuit portion associated with each row bank. In one embodiment, the local control circuit portion may include local precharge circuitry and local pull-down circuitry. Another code portion is provided for generating a plurality of local source line decoder circuits (or, local center circuits) corresponding to the number of row banks, each local source line decoder circuit operating responsive to at least one BS signal and a column address for selecting a particular column of the N columns. Yet another code portion is included for generating a global I/O and sense amp circuit block associated with the ROM memory instance for sensing data on global bitlines corresponding to the N columns of the array.

In a still further aspect, the present invention is directed to memory operation method associated with a ROM instance, the ROM instance having a plurality of ROM cells organized in an array having M rows and N columns, wherein each of the N columns is associated with a precharged source line that is partitioned into a number of source line segments based on a number of row banks of the array. Upon providing row address and column address signals for accessing a ROM cell location, a BS signal is generated based on the row address signals that correspond to the selected ROM cell location's row. Based on the column address signals and the BS signal, a pull-down control signal is generated by a local source line decoder circuit for deactivating a source line segment associated with the ROM cell location, whereupon a read voltage differential is developed on a global bitline associated therewith. Thereafter, the read voltage differential is sensed by a global I/O and sense amp circuit for outputting, whereupon the local source line segment is precharged again.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
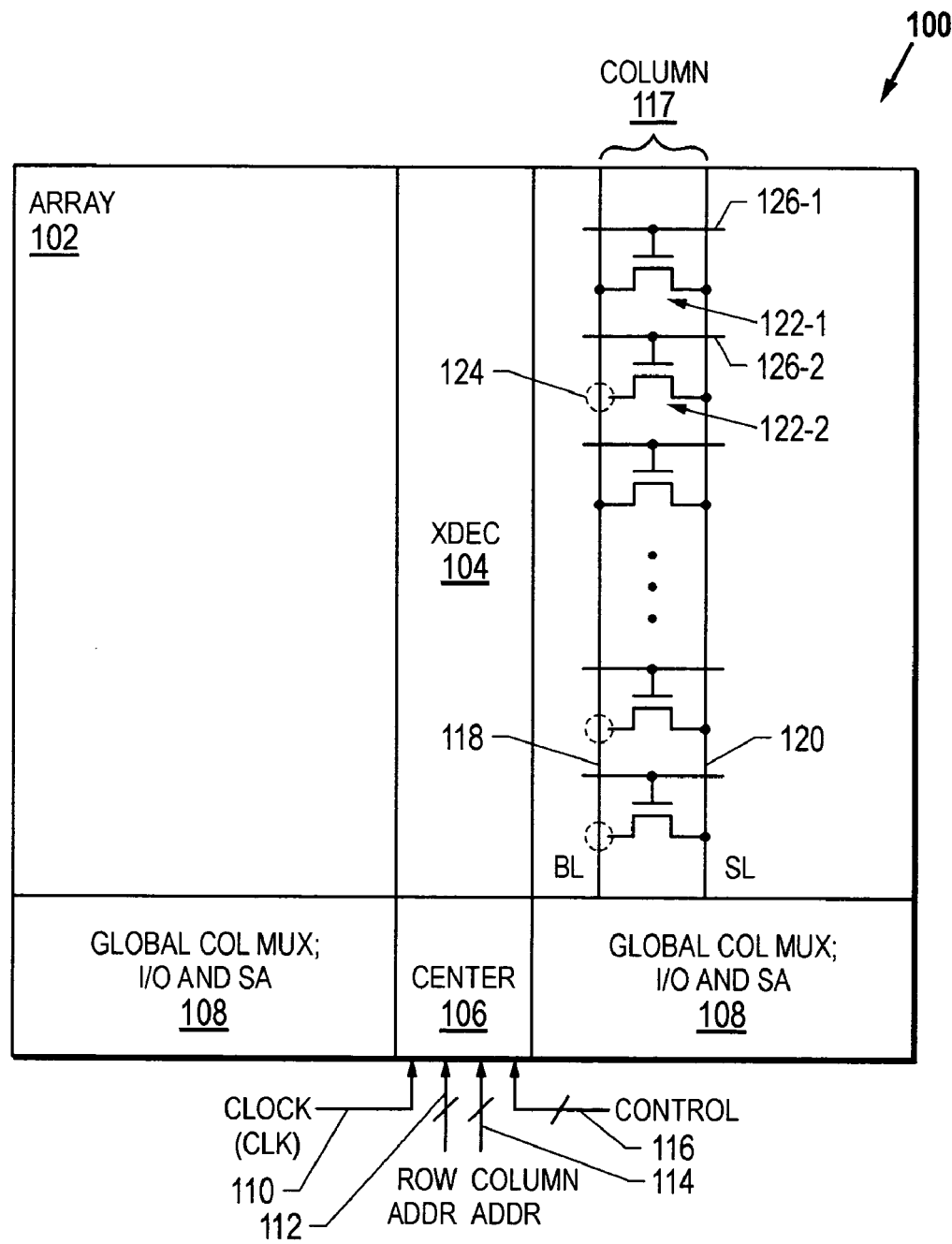
FIG. 1 (Prior Art) depicts a conventional ROM with decoded source line architecture.

In the drawings, like or similar elements are designated with identical reference numerals throughout the several views thereof, and the various elements depicted are not necessarily drawn to scale. Referring now to FIG. 1, depicted therein is a conventional ROM circuit 100 with decoded source line architecture. A plurality of ROM cells are organized into an array 102 with a row decoder (i.e., XDEC) 104 disposed therein. A center control circuit 106 is operable to receive a plurality of control signals, timing signals, address signals, et cetera, for generating appropriate internal signals in order to effectuate memory operations in conventional manner. By way of illustration, reference numerals 110, 112, 114 and 116 respectively refer to a clock (CLK) signal, row address (X-address) signals, column address (Y-address) signals, and control signals (e.g., memory select signals, read/write enable and disable signals, and the like).

A global circuit block 108 disposed at one end of the array 102 includes column multiplexer (COLMUX) circuitry, sense amplifier (SA) circuitry and input/output (I/O) drive circuitry. As is well known, precharged global bitlines (BLs) coupled to the drains of the ROM cells span the height of the array 102 in Y-direction and are operable to carry data voltages depending on the type of data. Selection of a particular BL column of ROM cells is dependent on the supplied column address, which is appropriately decoded by the decoding circuitry. Likewise, precharged global source lines (SLs) which are selected based on the decoding of the corresponding bitlines (i.e., column decoding) are coupled to the sources of the ROM cells and also span the entire height of the array 102 in Y-direction. By way of example, a column 117 of ROM cells is illustrated in FIG. 1, wherein BL 118 and SL 120 are provided for a plurality of ROM cells comprising the column 117. ROM cells 122-1, 122-2 are illustrative, each cell is being exemplified as a Field Effect Transistor (FET). Reference numerals 126-1 and 126-2 refer to the two wordlines (WLs) that couple to the gates of ROM cells 122-1 and 122-2, respectively. Whereas the sources of ROM cells 122-1 and 122-2 are coupled to SL 120 (as are the sources of the entire column 117), the respective drains may or may not be connected to the corresponding BL 118 depending on the data programmed thereat. If there is no connection made between the drain of a ROM cell and its corresponding BL during fabrication, for example, a data bit of one logic state is stored thereat. As illustrated, reference numeral 124 refers to an open connection between the drain of cell 122-2 and BL 118. On the other hand, a data bit of another logic state is stored where there is a connection between the drain and corresponding BL.

Although providing precharged source lines such as described above is advantageous in that static leakage due to sub-threshold current is eliminated, additional issues remain. As alluded to in the Background section of the present application, functional leakage continues to play a substantial role when the source line of a selected column is pulled low in order to enable a memory access operation. Further, since the source lines can be highly capacitive (for example, where the entire column is programmed with binary 0's) and a full rail swing (from $V_{DD}$ to ground) is required in memory operations, power consumption can be significant.

Figure 2:
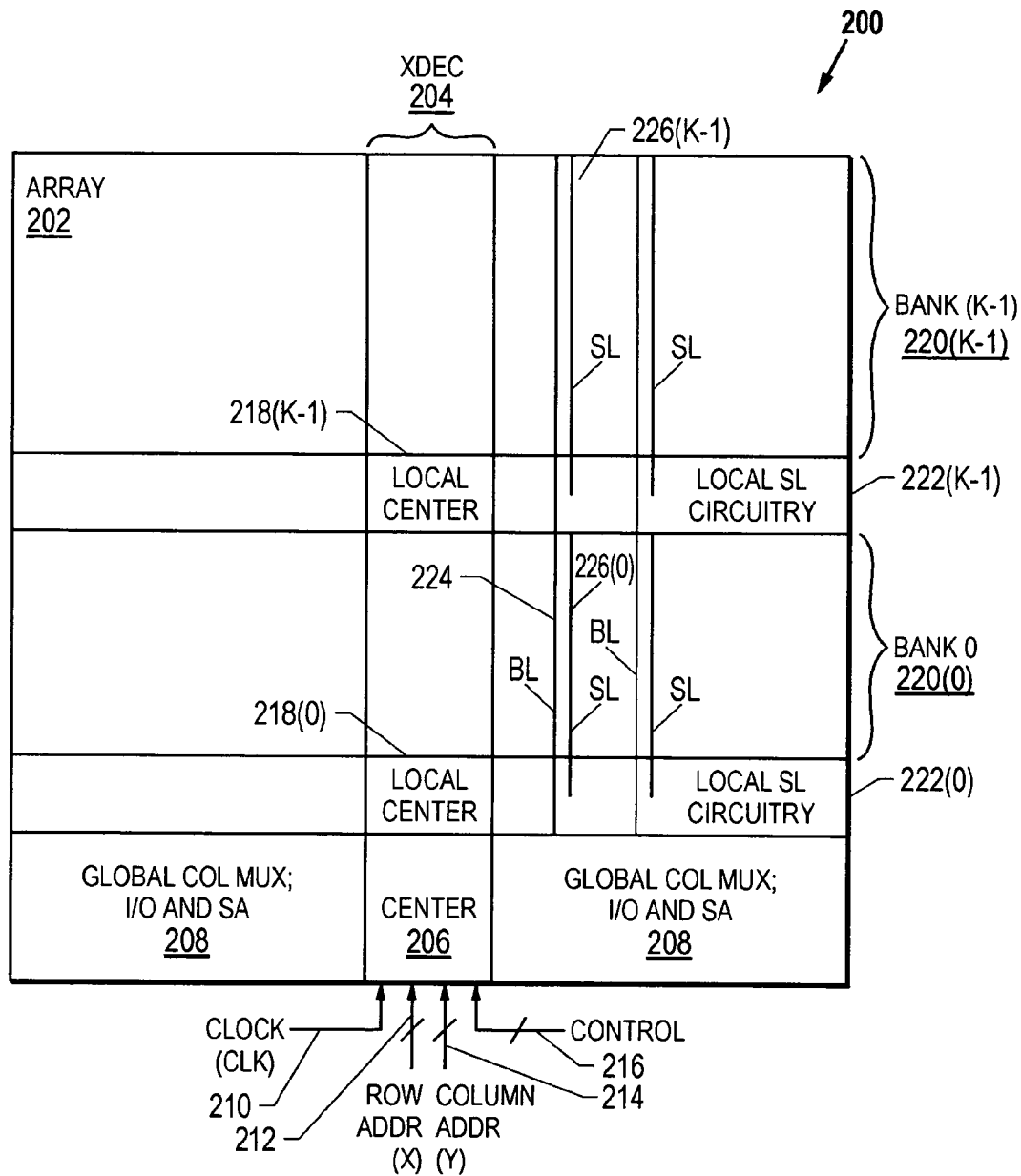
FIG. 2 depicts an exemplary ROM with partitioned source line architecture according to one embodiment of the present invention.

FIG. 2 depicts an exemplary ROM instance 200 with partitioned source line architecture according one embodiment of the present invention. A plurality of ROM cells of any known or heretofore unknown type, technology, process, and/or design are organized as an array 202, e.g., an array with M rows and N columns. Similar to conventional ROM circuits, a row decoder (XDEC) 204, center control circuitry 206 and global circuitry 208 are associated with the array 202, wherein clock 210, row address signals 212, column address signals 214 and additional control signals 216 are supplied in normal manner. Likewise, the global circuitry 208 includes COLMUX circuitry, SA and I/O drive circuitry, and the like, for facilitating I/O operations conventionally.

In accordance with the teachings of the present invention, whereas BLs associated with the ROM cell columns span globally the height of the array 202, the corresponding source lines are partitioned based on row banking of the array. Accordingly, each decoded SL corresponding to a particular BL is provided as a plurality of SL segments, wherein each SL segment is activatable only with respect to a corresponding row bank. By way of illustration, the array 202 includes K row banks, Bank(0) 220(0) through Bank (K-1) 220(K-1) (each having M/K rows), such that each of the N decoded source lines is partitioned into K segments. Precharge circuitry and pull-down circuitry associated with the SL segments for each of the banks is provided by way of a local SL control circuit portion disposed in the array 202. For example, local SL control circuitry portion 222(0) is operable with respect to the N SL segments of Bank(0) 220(0) and local SL control circuitry portion 222(K-1) is operable with respect to the N SL segments of the $K^{th}$ bank, i.e., Bank(K-1) 220(K-1).

As will be described in greater detail hereinbelow, each local SL control circuitry portion is activatable based on control signals provided by a corresponding local center circuit (i.e., local SL decoder circuit) that may be co-located with the XDEC circuitry in one embodiment. In FIG. 2, by way of illustration, reference numerals 218(0) through 218

(K-1) refer to K local centers which correspond to the K local SL control circuitry portions disposed in the array 202.

Figure 3:
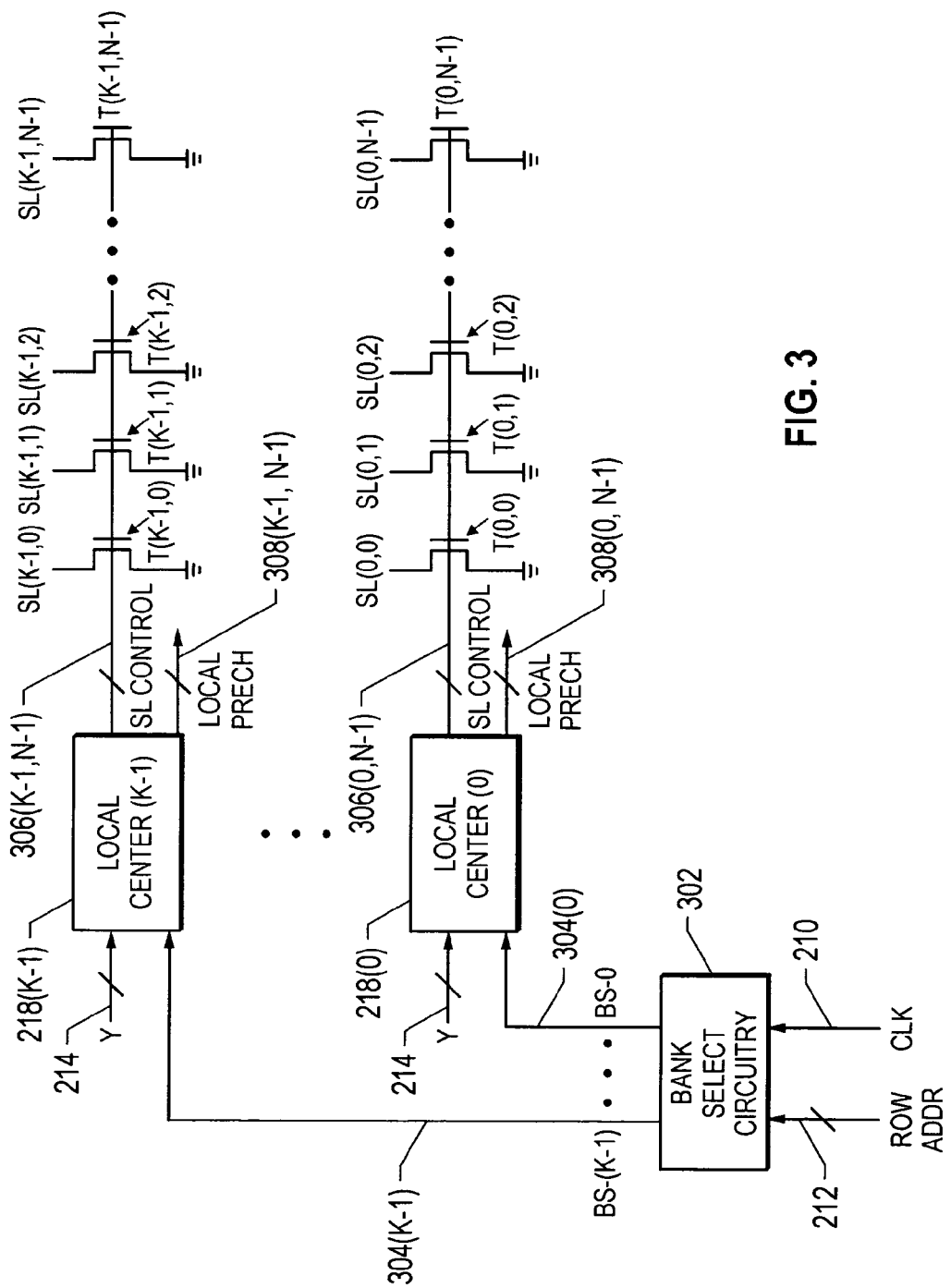
FIG. 3 depicts additional details of the ROM shown in FIG. 2 wherein local center circuit portions (i.e., local source line decoder circuit portions) generate local control signals with respect to the source line segments in accordance with the teachings of the present invention.

FIG. 3 depicts additional details of the ROM instance 200 shown in FIG. 2 wherein the local center circuit portions generate local control signals with respect to the K source line segments in accordance with the teachings of the present invention. A Bank Select circuit 302 is operable responsive to row address signals 212 and clock 210 for generating a plurality of Bank Select (BS) signals BS(0) 304(0) through BS(K-1) 304(K-1), each of which is driven to a corresponding local center depending on the selected ROM wordline. That is, if a row address indicates that the selected WL is in Bank(i), i=0,1, . . . , (K-1), BS(i) is provided to the local center (i) for activating appropriate SL decoding circuitry thereat. Each local center (i) is operable responsive to BS(i) as well as at least a portion of column address signals 214 that are decoded to select a particular column, for generating a plurality of control signals which drive SL pull-down circuitry and precharge circuitry of the $i^{th}$ local SL control portion disposed in the array 202.

By way of exemplary implementation, each SL segment in a bank may be individually precharged that is driven low via a separate pull-down device in preparing for a memory access operation. Thus, as illustrated, local center (0) 218(0) generates a plurality of precharge control signals 308(0,N-1) as well as a plurality of SL pull-down control signals 306(0,N-1), wherein each SL control signal (j) controls a corresponding pull-down device (j) coupled to the precharged SL segment (j), j=0,1, . . . , (N-1), of Bank(0). Reference labels T(0,0); T(1,0); . . . ; T(0,N-1) refer to the N pull-down devices disposed in the local SL control circuitry portion associated with Bank(0). Thus, a particular T(0,j) is operable to drive SL segment (0,j) low when SL control signal (0,j) is decoded by the local center (0) associated with Bank(0), j=0,1, . . . , (N-1). In similar fashion, local center (K-1) 208(K-1) generates a plurality of precharge control signals 308(K-1,N-1) as well as a plurality of SL pull-down control signals 306(K-1,N-1), wherein each SL control signal (j) controls a corresponding pull-down device (j) coupled to the precharged SL segment (j), j=0,1, . . . ,(N-1), of Bank(K-1). Also, reference labels T(K-1,0); T(K-1,1); . . . ; T(K-1,N-1) refer to the N pull-down devices disposed in the local SL control circuitry portion associated with Bank(K-1). Accordingly, a particular T(K-1,j) is operable to drive SL segment (K-1,j) low when SL control signal (K-1,j) is decoded by the local center (K-1) associated with Bank(K-1), j=0,1, . . . ,(N-1). Those skilled in the art should appreciate upon reference hereto that in an alternative embodiment a single set of control signals controlling both precharging and pull-down circuitry (using appropriate logic) may be provided for the SL segments on a bank-by-bank basis as part of the local SL control circuitry portion.

Figure 4:
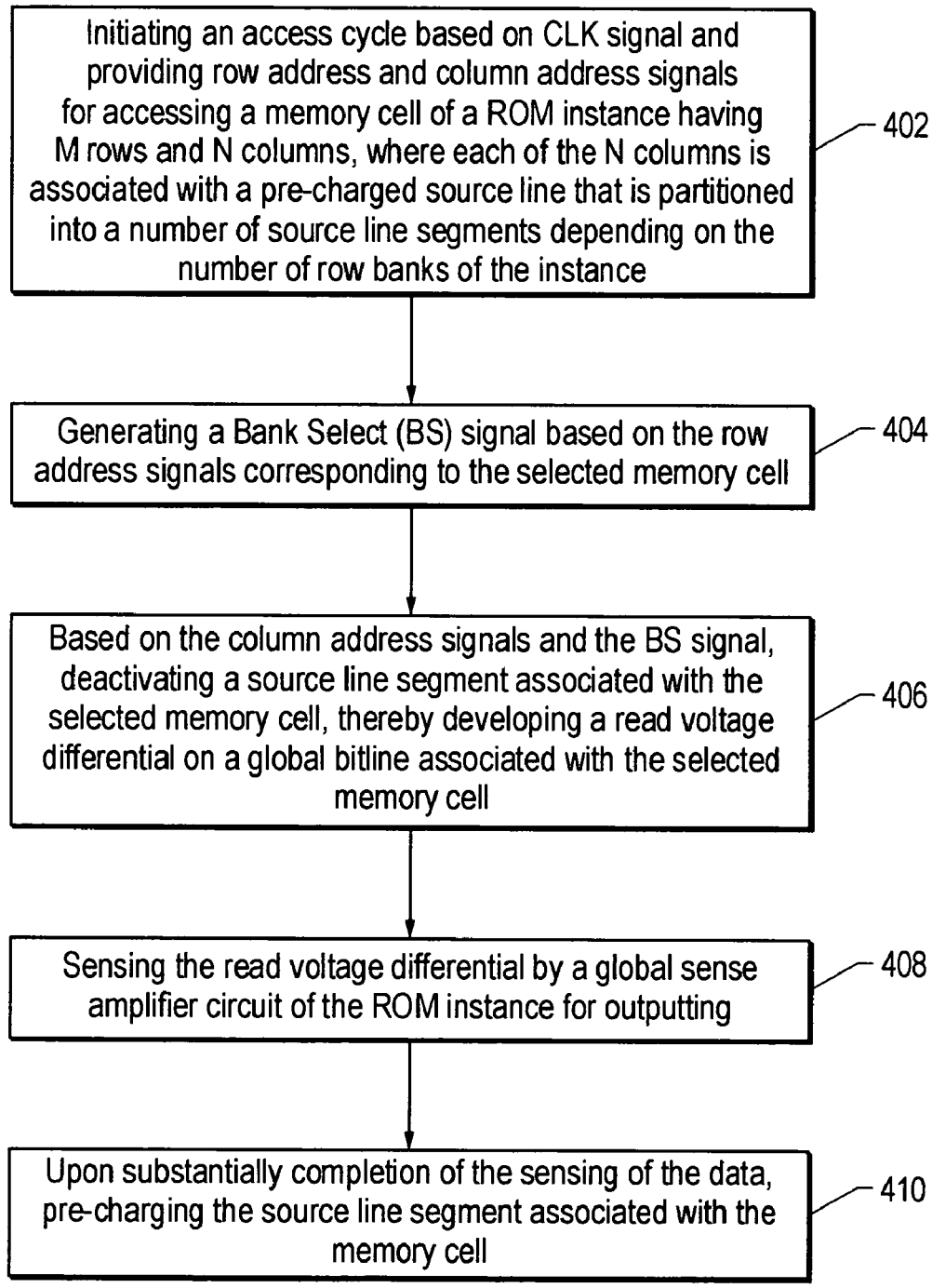
FIG. 4 is a flow chart of a memory operation method according to one embodiment of the present invention.

FIG. 4 is a flow chart of a memory operation method according to one embodiment of the present invention. Upon initiating an access cycle based on asserting an appropriate clock signal, row address and column address signals are provided for accessing a memory cell of a ROM instance having M rows and N columns, wherein each of the N columns is associated with a precharged source line that is partitioned into a number of SL segments depending on the number of row banks of the instance (block 402). A Bank Select (BS) signal is generated thereafter based on the row address signals corresponding to the selected memory cell (block 404). Based on the columns address signals and the BS signal, a local center decoder generates a local control signal for deactivating a source line segment associated with the selected memory cell, whereby a read voltage differential is developed on the associated global bitline (block 406). Subsequently, a global SA circuit senses the read voltage differential for outputting appropriate data (block 408). Upon at least substantial completion of the sensing of the data, the source line segment associated with the accessed memory cell is precharged again for subsequent access operations (block 410).

Figure 5:
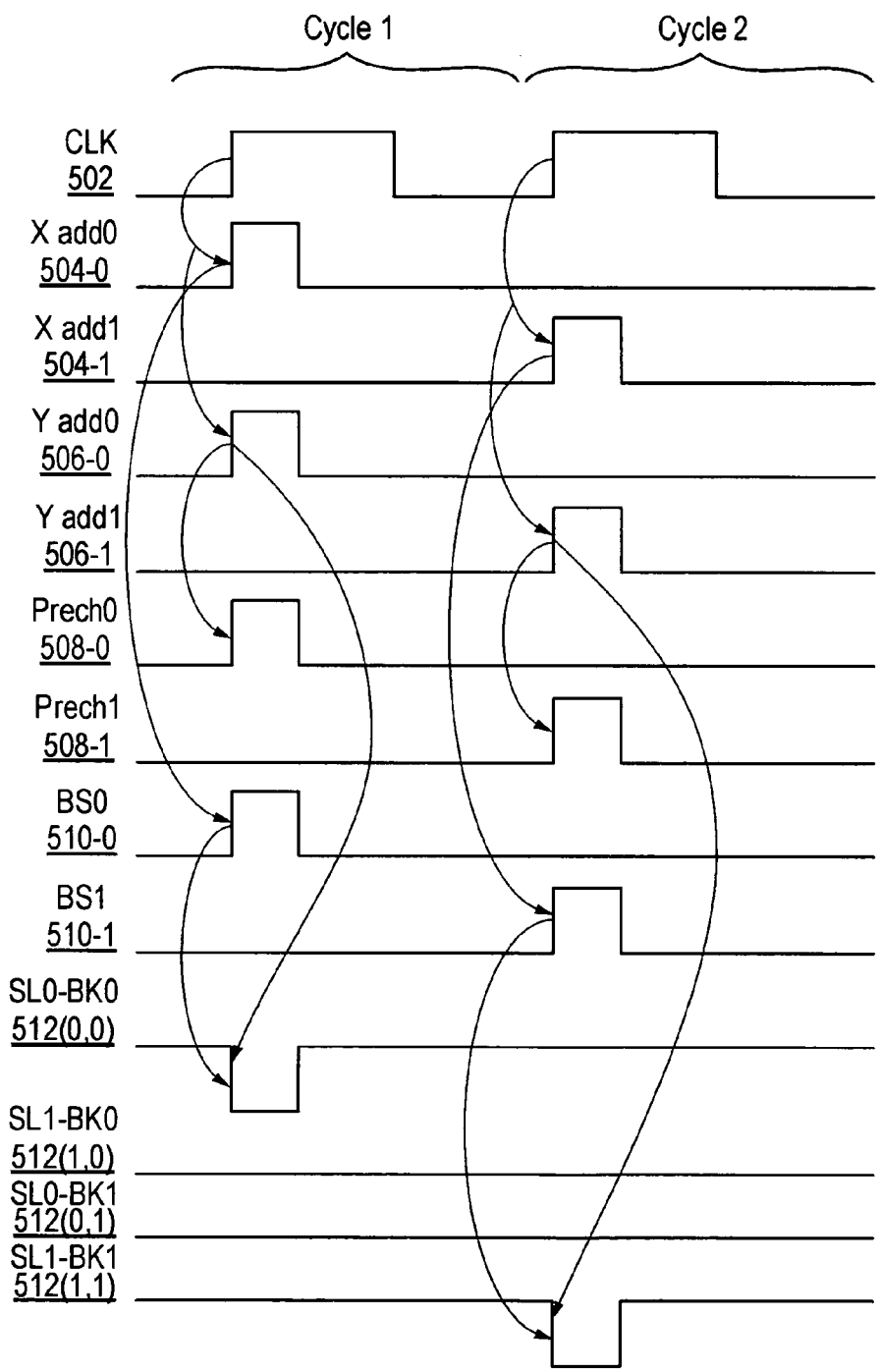
FIG. 5 depicts a set of waveforms relating to a memory operation method in accordance with one embodiment of the present invention.

FIG. 5 depicts a set of waveforms relating to a memory operation method in accordance with one embodiment of the present invention, wherein two access cycles are exemplified. Two address pairs are supplied: (Xadd0 504-0 and Yadd0 506-0) for cycle 1 and (Xadd1 504-1 and Yadd1 506-1) for cycle 2. When CLK 502 is asserted, Xadd0 and Yadd0 are asserted. Responsive to Xadd0, BS0 510-0 is asserted (by the Bank Select circuitry as described hereinabove). The precharging of BL0 (which is effectuated via a P-channel FET device driven by Prech0 508-0) is deactivated responsive to Yadd0 in preparation for the access operation. Responsive to Yadd0 and BS0, a control signal generated by the local center associated with Bank(0) is driven to the SL segment (SL0-BK0) corresponding to BL0, which control signal drives the pull-down device associated therewith whereby the precharged SL0-BK0 512(0,0) is pulled to ground. As illustrated, SL0-BK0 512(0,0) is precharged again (to $V_{DD}$, for example).

In similar fashion, when cycle 2 is commenced upon assertion of CLK 502, Xadd1 and yadd1 are asserted. Prech1 508-1 is driven high so that the precharging of BL1 (corresponding to Yadd1) is removed. Responsive to Xadd1, BS1 510-1 is generated. Responsive to Yadd1 and BS1, the corresponding SL segment (SL1-BK1) 512(1,1) is driven low, which is brought back to the precharge level again.

Based on the foregoing, it should be appreciated that the present invention provides a simple yet efficient and elegant architectural scheme whereby decoded source lines are partitioned into a plurality of segments such that the functional leakage is advantageously minimized (because each SL segment is now coupled to only M/K rows instead of M rows, i.e., the entire height of an array) while the ease of SL decoding is maintained. Also, by banking SL segments, capacitance is reduced significantly, resulting in power savings. In addition, by partitioning only the source lines and keeping the bitlines global (i.e., by not fully banking both source lines as well as bitlines, which requires separate local column mux circuitry, bitline precharge circuitry, I/O and SA circuitry, besides the local SL decoding circuitry for each bank), the deficiencies of the prior art (i.e., power consumption, leakage, etc.) are advantageously overcome without incurring a major area expense. Accordingly, embodiments of the present invention are particularly advantageous in low-power ROM applications. Furthermore, one of ordinary skill in the art should recognize that the teachings of the present invention may be practiced in standalone ROM devices of any type, technology, process, and/or design (e.g., programmable ROMs, masked ROMs, erasable programmable ROMs, electrically erasable programmable ROMs, Flash ROMs, et cetera), as well as compilable ROM applications having one or more ROM instances that are generated using appropriate memory compilers.

It is believed that the operation and construction of the present invention will be apparent from the foregoing Detailed Description. While some aspects of the method and circuitry shown and described may have been characterized as being preferred, it should be readily understood that various changes and modifications could be made therein without departing from the scope of the present invention as set forth in the following claims.

What is claimed is:

1. A Read-Only Memory (ROM) instance, comprising:
a plurality of ROM cells organized as an array having M rows and N columns, wherein said M rows are grouped into K banks; and
a partitioned source line associated with each of said N columns, said partitioned source line including a plurality of source line segments, each segment being decodable based on a Bank Select (BS) signal that is operable to select a bank and on a column address for selecting a particular column of said N columns.

2. The ROM instance as set forth in claim 1, wherein each segment of said partitioned source line is individually precharged to a predetermined level.

3. The ROM instance as set forth in claim 2, wherein a particular segment of said partitioned source line is operable to be driven low upon commencing a memory access operation, provided a ROM cell associated with said particular segment is selected.

4. The ROM instance as set forth in claim 3, wherein each of said N columns is associated with a global bitline.

5. The ROM instance as set forth in claim 4, wherein said BS signal is generated based on a plurality of row address signals supplied to said ROM instance.

6. The ROM instance as set forth in claim 5, wherein each bank is associated with a local circuit portion including precharge circuitry for precharging N source line segments corresponding to said grouping.

7. The ROM instance as set forth in claim 6, wherein said local circuit portion includes pull-down circuitry for driving low a particular one of said N source line segments based on a column address.

8. The ROM instance as set forth in claim 5, wherein each ROM cell comprises a Field Effect Transistor (FET) device whose source is coupled to said partitioned source line.

9. The ROM instance as set forth in claim 5, wherein each of said banks comprises one of 16, 32, 64, 128, 256, and 512 rows.

10. The ROM instance as set forth in claim 5, wherein each source line segment is decoded by a local source line decoder circuit.

11. A memory compiler for compiling at least one Read-Only Memory (ROM) instance, comprising:
a code portion for generating a plurality of ROM cells organized as an array having M rows and N columns, wherein said M rows are grouped into K row banks and each of said N columns is associated with a partitioned source line that comprises a plurality of source line segments corresponding to said K row banks of said array;
a code portion for generating a local circuit portion associated with each row bank, said local circuit portion including local precharge circuitry and local pull-down circuitry;
a code portion for generating a plurality of local source line decoder circuits corresponding to said row banks, each local source line decoder circuit operating responsive to at least one Bank Select (BS) signal and at least a portion of a column address for selecting a particular column of said N columns; and
a code portion for generating a global input/output circuit block associated with said ROM memory instance for sensing data on global bitlines corresponding to said N columns.

12. The memory compiler for compiling at least one ROM memory instance as set forth in claim 11, wherein said at least one BS signal is generated based on a plurality of row address signals.

13. The memory compiler for compiling at least one ROM memory instance as set forth in claim 11, wherein said local pull-down circuitry comprises N-channel field-effect transistor (N-FET) devices.

14. The memory compiler for compiling at least one ROM memory instance as set forth in claim 11, wherein each of said row banks comprises one of 16, 32, 64, 128, 256, and 512 rows.

15. The memory compiler for compiling at least one ROM memory instance as set forth in claim 11, wherein said pull-down circuitry is operable to drive low a particular one of said source line segments upon commencing a memory access operation.

16. The memory compiler for compiling at least one ROM memory instance as set forth in claim 11, further comprising a code portion for generating a reference I/O block associated with said ROM memory instance.

17. The memory compiler for compiling at least one ROM memory instance as set forth in claim 11, wherein each ROM cell comprises a Field Effect Transistor (FET) device whose source is coupled to said partitioned source line.

18. A memory operation method associated with a Read-Only Memory (ROM) instance, said ROM instance having a plurality of ROM cells organized in an array having M rows and N columns, wherein each of said N columns is associated with a precharged source line that is partitioned into a number of source line segments based on a number of row banks of said array:
providing row address and column address signals for accessing a ROM cell location;
based on said row address signals corresponding to said ROM cell location's row, generating a Bank Select (BS) signal;
based on said column address signals and said BS signal, deactivating a source line segment associated with said ROM cell location, thereby developing a read voltage differential on a global bitline associated therewith;
sensing said read voltage differential by a global sense amplifier (sense amp) circuit for outputting; and
upon substantial completion of said sensing, precharging said source line segment.

19. The memory operation method associated with a ROM instance as set forth in claim 18, wherein said source line segment is deactivated by a pull-down control signal generated by a local source line decoder circuit that is associated with a selected row bank.

20. The memory operation method associated with a ROM instance as set forth in claim 19, wherein said selected row bank comprises one of 16, 32, 64, 128, 256, and 512 rows.

* * * * *